United States Patent [19]

Gibson et al.

[11] 4,321,624

[45] Mar. 23, 1982

[54] AFT CIRCUIT

[75] Inventors: Walter G. Gibson, Princeton; Frank C. Liu, Piscataway, both of N.J.

[73] Assignee: RCA Corporation, New York, N.Y.

[21] Appl. No.: 955,516

[22] Filed: Oct. 30, 1978

[51] Int. Cl.$^3$ .............................................. H04N 5/50
[52] U.S. Cl. ................................. 358/195.1; 455/261
[58] Field of Search ........................... 358/195, 195.1; 325/422; 455/261

[56] References Cited

U.S. PATENT DOCUMENTS

| 3,444,477 | 5/1969 | Avins | 358/195 |
| 3,502,988 | 3/1970 | Shelby | 325/422 |

FOREIGN PATENT DOCUMENTS

| 453858 | 9/1936 | United Kingdom . |
| 669965 | 4/1952 | United Kingdom . |
| 762770 | 12/1956 | United Kingdom . |
| 821484 | 10/1959 | United Kingdom . |
| 896688 | 5/1962 | United Kingdom . |
| 916160 | 1/1963 | United Kingdom . |
| 1105114 | 3/1968 | United Kingdom . |
| 1260525 | 1/1972 | United Kingdom . |
| 1355392 | 6/1974 | United Kingdom . |
| 1420769 | 1/1976 | United Kingdom . |

*Primary Examiner*—Richard Murray
*Attorney, Agent, or Firm*—Paul J. Rasmussen; William H. Meagher; W. Brinton Yorks, Jr.

[57] ABSTRACT

An automatic fine tuning (AFT) circuit is provided which generates an AFT control signal in response to a video intermedate frequency (I.F.) signal. The I.F. signal is supplied to the input of a current source amplifier, which provides current signals of like phase relationship to a discriminator network. The discriminator network is comprised of two tuned circuits, one of which is resonant at a frequency below the desired frequency of the I.F. picture carrier, and the other resonant at a frequency above the desired frequency. The tuned circuits develop voltage variations which vary differentially in magnitude in response to the frequency deviation of the I.F. picture carrier from its desired frequency. The differentially related voltages are detected by two peak detector networks for use as AFT control signals. The current source amplifier and peak detector networks may be conveniently fabricated on a single I.C. chip. The tuned circuits are coupled to the current source amplifier and peak detector networks through two external I.C. terminals.

10 Claims, 8 Drawing Figures

AFT CIRCUIT

This invention relates to automatic frequency control apparatus in general, and, in particular, to such apparatus for deriving a frequency dependent error-correction signal to control the tuning of a local oscillator in a superheterodyne receiver.

It is the function of a television tuner to select a single narrow range of frequencies from among the many broadcast frequencies in the radio frequency band. A conventional television tuner performs this function through the use of a radio frequency amplifier, a mixer, and a local heterodyne oscillator. The output of the oscillator is compared to, or beat with, the radio frequency television signal received from the receiver antenna by the mixer. This beating action creates both the sum and difference frequencies of the original radio frequency and local oscillator frequencies. All but the difference frequencies, called intermediate frequencies (I.F.), are filtered out. These I.F. signals are amplified and detected by the television receiver to recreate the desired sound and picture information.

In order to provide the optimum image on the television screen, together with accurate sound reproduction, it is necessary that the receiver local oscillator be adjusted so that the picture and sound carriers are located at the correct points in the I.F. passband of the television receiver. This is especially true in the tuning of color television receivers. Not only must the picture and sound carriers be situated at their proper positions in the I.F. passband but the color subcarrier must also be properly positioned in order that the colors will be reproduced by the kinescope with proper hue and saturation characteristics. If the local oscillator is for any reason not set at the proper frequency, the I.F. signal frequencies will be incorrect, and may deleteriously affect the reproduced sound and picture. This mistuning may be due to improper fine tuning by the television viewer, local oscillator drift, or inaccurate resetability of the detenting action of a mechanical tuner. In order to overcome these problems, conventional receivers are provided with means for compensating for variations in the intermediate frequencies.

This compensation is normally accomplished by deriving an automatic fine tuning (AFT) voltage from the output of the I.F. amplifying stage of the receiver. The AFT voltage is representative of the sense and degree that the I.F. signal departs from the desired I.F. signal. The AFT voltage is applied to a voltage responsive reactance device in the local oscillator to correct the mistuning of the oscillator and thereby optimize the sound and picture reproduction.

The AFT voltage is derived from the I.F. signal by a discriminator network. The discriminator is comprised of reactive elements and converts shifts in I.F. signal frequency to voltage variations in an output signal. Generally, the discriminator network is tuned to the frequency of the I.F. picture carrier (45.75 MHz in the NTSC system), which is located on the upper vestigial slope of the I.F. passband. The change in the voltage level of the discriminator output signal for a given shift in frequency of the I.F. picture carrier defines the response characteristic of the discriminator network. It is desirable that this response characteristic be symmetrical; that is, for the output signal to exhibit equal magnitude voltage changes for identical frequency shifts of the I.F. picture carrier above and below its nominal center frequency. Moreover, it is desirable for the discriminator output signal to respond to small shifts in the I.F. picture carrier frequency by producing large changes in the voltage level of the discriminator output signal. This response determines the speed at which the television receiver will adjust the local oscillator frequency for shifts of the I.F. signal frequencies and the precision to which the I.F. picture carrier is maintained at its desired frequency and is measured by the slope of the discriminator characteristic curve; the steeper the slope, the faster the response and the better the precision of the AFT system.

There are presently two types of AFT circuits in general use: The quadrature detector type and the differential envelope detector type. The quadrature detector type AFT circuit converts frequency shifts of a frequency modulated signal to differentially phase-shifted signals by applying the frequency modulated signal to a filter network, which develops two differentially phase-shifted, or delayed, signals at its output ports. The differentially phase-shifted signals are coupled to a quadrature, or phase detector, which converts the relative phase difference between the signals at the filter output ports to an amplitude-varying AFT control signal. The differential envelope detector type AFT circuit, such as that described in the present application, utilizes a linear filter network to convert frequency shifts of a frequency modulated signal to differentially related, amplitude varying signals. These signals are coupled to envelope detectors, which convert the amplitude varying signals to an AFT control signal. The differential envelope detector AFT circuit generally requires fewer components than the quadrature detector type, and is preferred in many applications because of its ability to produce a narrower, more precisely controlled AFT bandwidth. The narrower bandwidth reduces the effect of I.F. noise on the AFT control system and produces sharper AFT response in the vicinity of the I.F. picture carrier being controlled by the system.

In order to minimize the size and number of components required to construct an AFT circuit, it is desirable to fabricate the circuit in integrated circuit form on a single monolithic integrated circuit chip. However, certain AFT circuit elements, specifically, the reactive components used to construct the discriminator network, do not readily lend themselves to integrated circuit fabrication and must be located external to the I.C. chip. The I.C. chip has only a limited number of external connection points, or terminals, for connection to external components. Hence, it is desirable to construct the AFT circuit in a manner which reduces the number of required connections to external components.

The AFT circuit described in co-pending U.S. patent application, Ser. No. 955,515 entitled, "AFT Circuit", by Jack Craft, illustrates a novel AFT circuit requiring only two integrated circuit connections to an external discriminator network. The discriminator network shown in the Craft application utilizes two tuned circuits, one of which requires a tapped inductor coil. This application uses the techniques of the Craft application to produce a simpler AFT circuit having two integrated circuit connections to an external discriminator network which does not use a tapped inductor coil.

In accordance with the principles of the present invention, an AFT circuit is provided which generates AFT control signals in response to a video I.F. signal. The I.F. signal is supplied to the input of a current source amplifier, which provides current signals of like phase to a discriminator network. The discriminator is comprised of two tuned circuits. One of the tuned circuits is resonant at a frequency below the desired frequency of the I.F. picture carrier, and the other is resonant at a frequency above the desired frequency. The tuned circuits develop output signals in response to the input current signals which vary differentially in sense and degree with frequency deviation of the I.F. picture carrier from its desired frequency. These differentially related signals are detected by two peak detector networks for use as AFT control signals. The current source amplifier and peak detector networks may be conveniently fabricated on a single I.C. chip. The discriminator network is coupled to the current source amplifier and peak detectors through two external I.C. terminals.

In accordance with a further aspect of the present invention, the discriminator network may be constructed to compensate for the effects of changes in the amplitude of the I.F. picture carrier resulting from frequency deviation of the carrier along the vestigial slope of the I.F. passband. The picture carrier will increase in amplitude as it deviates in frequency from its normal location on the midpoint of the vestigial slope of the I.F. passband toward the center frequency of the passband, and will decrease in amplitude as it deviates away from the center frequency, thereby creating a smaller AFT pull-in range for deviations in the latter direction than the former. Also, noise contributions to the AFT system will be weighted in favor of noise components having frequencies in the vicinity of the center frequency of the passband. The discriminator can be compensated to overcome the lack of symmetry of the AFT pull-in range about the normal location of the I.F. picture carrier by increasing the impedance of the tuned circuit which is resonant at a frequency remote from both the center frequency of the passband and the desired frequency of the picture carrier, thereby creating a symmetrical discriminator response for frequency shifts in the vicinity of the desired frequency of the picture carrier.

The peak detected signals may be combined by a differential amplifier to produce an AFT signal for application to the local oscillator. In accordance with yet another aspect of the present invention, the impedance of the tuned circuit which is resonant at a frequency remote from both the center frequency of the I.F. passband and the desired frequency of the picture carrier may be increased still further, which causes the response characteristic of the AFT circuit to exhibit a crossover of the X-axis at a point intermediate to the desired locations of the audio and picture carriers. The response characteristic of the AFT circuit thus is of one polarity for a first frequency range which is adjacent to the desired frequency of the picture carrier and remote from the center frequency of the I.F. passband. The response characteristic has an opposite polarity for a second frequency range which extends from the desired frequency of the picture carrier to the crossover point, and is of the first polarity for a third frequency range which extends from the crossover point toward the desired location of the audio carrier. The resultant characteristic contains substantially equal energy of both polarities, which causes the effects of noise passed by the I.F. amplifier to be virtually canceled. This cancelling of noise effects prevents noise-induced shifting of the desired location of the picture carrier, to which the AFT circuit retunes the local oscillator.

When the I.F. signal experiences slight frequency shifts such that the picture carrier moves into either the first or second frequency ranges on either side of its desired location, the AFT circuit responds by retuning the local oscillator, which pulls the I.F. signal back to its desired location in the I.F. passband. However, if the I.F. signal experiences a frequency shift of such great magnitude that the picture carrier is beyond the first frequency range of the response characteristic and hence outside the normal range of AFT control, the audio carrier, which is separated from the picture carrier by a constant frequency displacement, will be located in the third frequency range, in which the response characteristic is of the same polarity as the first range. Under these conditions, the AFT circuit will retune the local oscillator to pull the audio carrier back toward its desired location, and the displaced picture carrier will follow, until the picture carrier is again in the first frequency range and normal AFT control resumes.

Figure 1:
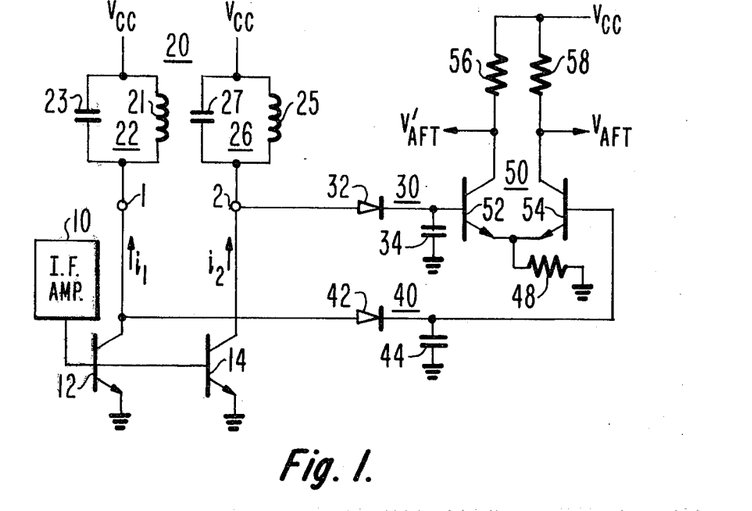
FIG. 1 illustrates, partially in block diagram and partially in schematic diagram form, an AFT circuit constructed in accordance with the principles of the present invention.

Referring to FIG. 1, an AFT circuit constructed in accordance with the principles of the present invention is illustrated in block diagram and schematic diagram form. An I.F. signal, including a nominal 45.75 MHz picture carrier, is coupled from an I.F. amplifier 10 to the base electrodes of two current source transistors 12 and 14, which may be located on an integrated circuit chip. The emitter electrodes of the current source transistors 12 and 14 are coupled to ground, and their collector electrodes are coupled to external I.C. terminals 1 and 2, respectively.

A discriminator network 20 which is comprised of two tuned circuits 22 and 26 is coupled externally to I.C. terminals 1 and 2. Tuned circuit 22 is comprised of the parallel combination of an inductor 21 and a capacitor 23 and is tuned to a resonant frequency slightly below the 45.75 MHz picture carrier frequency. Tuned circuit 22 is coupled between I.C. terminal 1 and a source of supply voltage $V_{CC}$. Tuned circuit 26 is similarly comprised of the parallel combination of an inductor 25 and a capacitor 27 and is tuned to a resonant frequency slightly above the 45.75 MHz picture carrier frequency. Tuned circuit 26 is coupled between I.C. terminal 2 and the $V_{CC}$ supply.

External I.C. terminals 1 and 2 are coupled internally to two peak detectors 40 and 30, respectively, which may be located on the same I.C. chip as current source transistors 12 and 14. Peak detector 40 is comprised of a diode 42 having an anode electrode coupled to terminal 1 and a cathode electrode coupled to ground by a peak detecting capacitor 44. Peak detector 30 is similarly comprised of a diode 32 having an anode electrode coupled to terminal 2 and a cathode electrode coupled to ground by a peak detecting capacitor 34.

The peak detectors 30 and 40 are coupled to two inputs of a differential amplifier 50 which is comprised of two transistors 52 and 54. The cathode electrode of diode 32 is coupled to the base electrode of transistor 52 and the cathode electrode of diode 42 is coupled to the base electrode of transistor 54. The emitter electrodes of transistors 52 and 54 are coupled together and to ground by a resistor 48. Reciprocally varying AFT control voltages are developed at the collectors of transistors 52 and 54, which are coupled to the $V_{CC}$ supply by load resistors 56 and 58, respectively.

When the I.F. input signal is applied to the bases of current source transistors 12 and 14, signal currents of like phase are developed at the collector electrodes of these transistors and are coupled to the discriminator network 20 by I.C. terminals 1 and 2. These currents flow into the respective tuned circuits 22 and 26. A D.C. path for these currents is established by inductors 21 and 25, respectively, which are coupled to the $V_{CC}$ supply.

The tuned circuits 22 and 26 respond to the flow of signal currents by coupling signals back to terminals 1 and 2 which vary with the frequency of the I.F. picture carrier. When the I.F. picture carrier is at its desired frequency of 45.75 MHz, the magnitude of the signal developed at terminal 1 by tuned circuit 22 is equal to the magnitude of the signal developed at terminal 2 by tuned circuit 26. As the I.F. picture carrier deviates in frequency from its desired location in the I.F. passband, the signals at terminals 1 and 2 vary inversely, with one increasing as the other decreases. For deviations in frequency lower than 45.75 MHz, the magnitude of the signal at terminal 1 increases as the magnitude of the signal at terminal 2 decreases; for deviation in frequency above 45.75 MHz, the signal at terminal 1 decreases as the signal at terminal 2 increases. Discriminator network 20 thus converts frequency deviations of the I.F. picture carrier to amplitude varying signals at terminals 1 and 2.

The differentially related voltages developed at terminals 1 and 2 are coupled to peak detectors 40 and 30, respectively, where they are peak detected across capacitors 44 and 34. The peak detected voltages are applied to the two inputs of differential amplifier 50, where they are combined and amplified to produce differentially varying AFT control voltages at the collectors of transistors 52 and 54.

Figure 2:
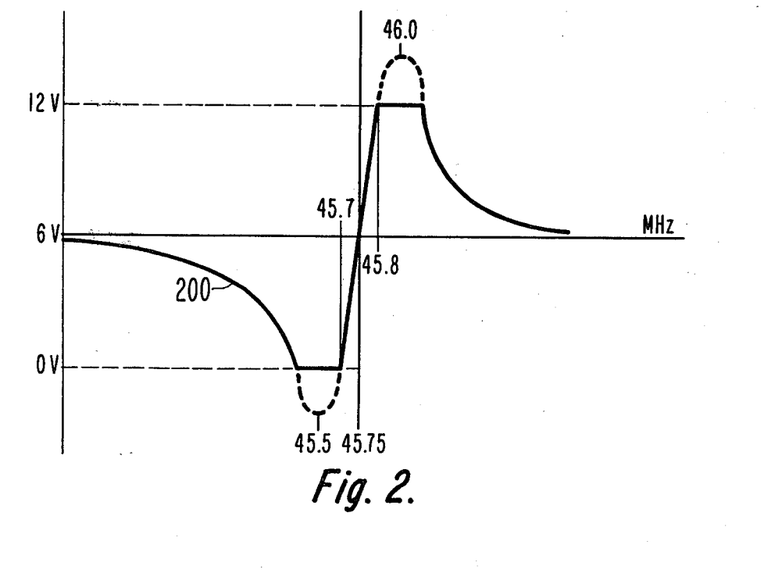
FIG. 2 illustrates the response characteristic of the AFT circuit of FIG. 1.

The response characteristic of the AFT circuit of FIG. 1 is illustrated in FIG. 2. In this example, it is assumed that the signal coupled to current source transistors 12 and 14 by I.F. amplifier 10 is amplitude limited, to eliminate the effects of amplitude changes of the I.F. picture carrier on the AFT output signal.

Referring to FIG. 2, a response characteristic 200 is shown, having a crossover at the X-axis (+6 volts) at the desired picture carrier frequency of 45.75 MHz. The tuned circuits 22 and 26 have resonant points which produce peaks in the response characteristic 200 at 45.5 MHz and 46.0 MHz, respectively. The response characteristic 200 is clipped around these resonant points due to the switching of the differential amplifier 50, which has maximum positive and negative excursions of +12 volts and 0 volts, respectively. The AFT circuit exhibits the greatest rate of response to variation in the picture carrier frequency in the vicinity of 45.75 MHz, between 45.7 MHz and 45.8 MHz. Within this range of frequencies, the AFT circuit will produce a signal change of one volt for every 8333 Hz change in the frequency of the I.F. picture carrier. The response characteristic 200 is also seen to be symmetrical within this range of frequencies.

Figure 3:
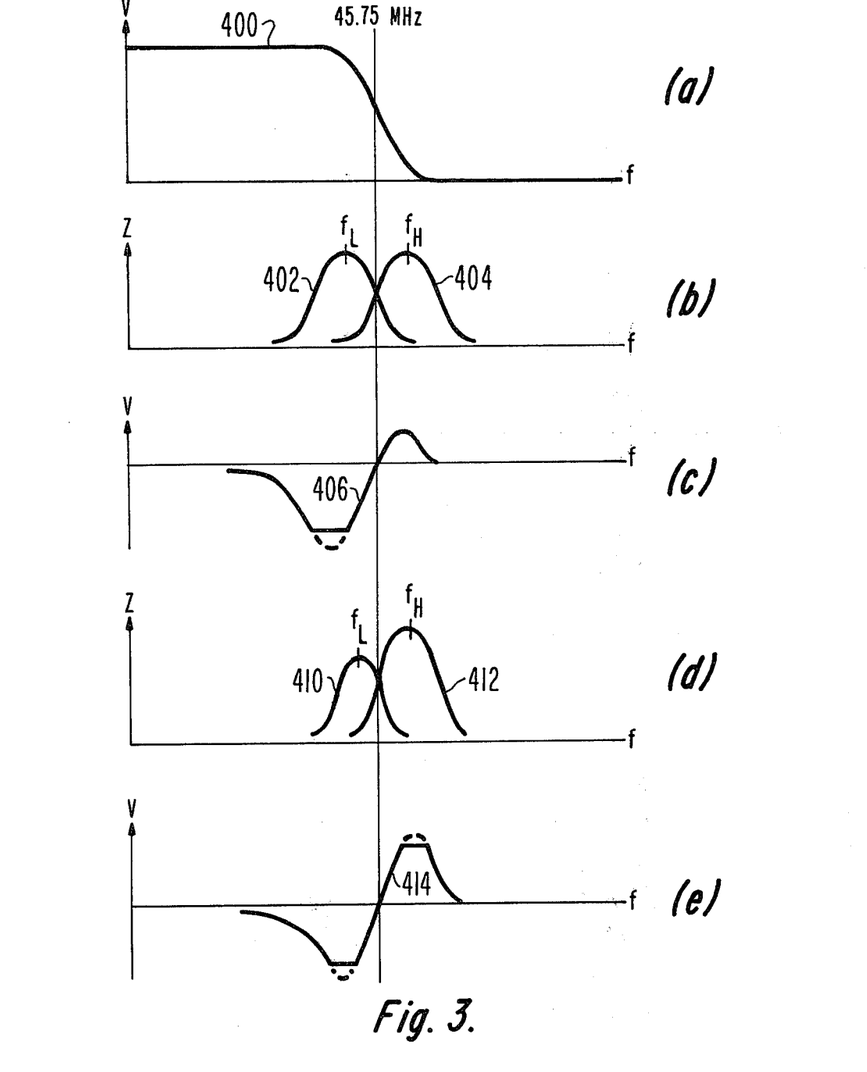
FIGS. 3a–3e illustrate waveforms depicting further operating features of the AFT circuit of FIG. 1.

Referring now to FIG. 3a, characteristic line 400 represents the upper portion of the response characteristic of the I.F. passband. The I.F. picture carrier is normally located at the midpoint of the upper vestigial slope of the I.F. passband, at 45.75 MHz.

FIG. 3b illustrates the impedances 402 and 404 of tuned circuits 22 and 26, respectively. In this example, the impedances and the Q's of the two tuned circuits are identical, and the circuits exhibit identical bandwidths about their center frequencies $f_L$ and $f_H$. Waveforms 402 and 404 have a crossover point at 45.75 MHz, the desired center frequency of the I.F. picture carrier.

When the I.F. picture carrier, which is located at the midpoint of the upper vestigial slope of the I.F. passband 400, is applied to the AFT circuit exhibiting the impedance characteristic shown in FIG. 3b, the AFT response characteristic 406 of FIG. 3c is produced. Response characteristic 406 is seen to be unbalanced due to the location of the I.F. picture carrier on the upper vestigial slope on the I.F. passband when the AFT circuit is not preceded by a limiter, which is a typical arrangement. Without a limiter, the I.F. picture carrier will vary in amplitude as it deviates from its nominal frequency of 45.75 MHz, and will have a greater amplitude at lower frequencies than at higher frequencies due to the slope of the I.F. passband. The resultant AFT pull-in range above 45.75 MHz will be smaller than the pull-in range below this center frequency, and the output signal is seen to be clipped for maximum negative excursions, but not for positive ones.

The nonsymmetrical response characteristic 406 of FIG. 3c may be improved by changing the impedance of tuned circuit 26, as illustrated in FIGS. 3d and 3e. In FIG. 3d, waveforms 410 and 412 represent the impedances of tuned circuits 22 and 26 as in FIG. 3b, except that the impedance of tuned circuit 26 has been increased. This may be done by increasing the L-C ratio of inductor 25 and capacitor 27 (higher L, lower C), or by increasing the quality factor (Q) of the circuit. However, since the tuned circuits 22 and 26 normally have high Q values (i.e., over 100), maintenance of a proper Q ratio between tuned circuits 22 and 26 at high Q values is difficult, and an inductor 25 with high Q is expensive; hence, it is usually desirable to increase the L-C ratio of tuned circuit 26, while maintaining its Q value. In this way the equal bandwidths at the three decibel points of tuned circuits 22 and 26 are retained, and the crossover of waveforms 410 and 412 can be maintained at 45.75 MHz.

When the I.F. picture carrier on the upper vestigial slope of the I.F. passband 400 is applied to the AFT circuit having the discriminator characteristic shown in FIG. 3d, the AFT response characteristic 414 of FIG. 3e is produced. Waveform 414 is seen to be symmetrical in its maximum amplitude excursions above and below the X-axis due to the higher impedance of waveform 412 at I.F. picture carrier frequencies above 45.75 MHz. At these higher frequencies, the decreased amplitude of the I.F. picture carrier due to the I.F. passband characteristic is compensated by the higher impedance of the discriminator 20, resulting in the production of response characteristic 414, which is seen to be clipped equally for both maximum positive and negative excursions. Response characteristic 414 will exert equal AFT control for positive and negative I.F. frequency deviations of like magnitude in the vicinity of the desired 45.75 MHz frequency of the I.F. picture carrier.

Figure 4:
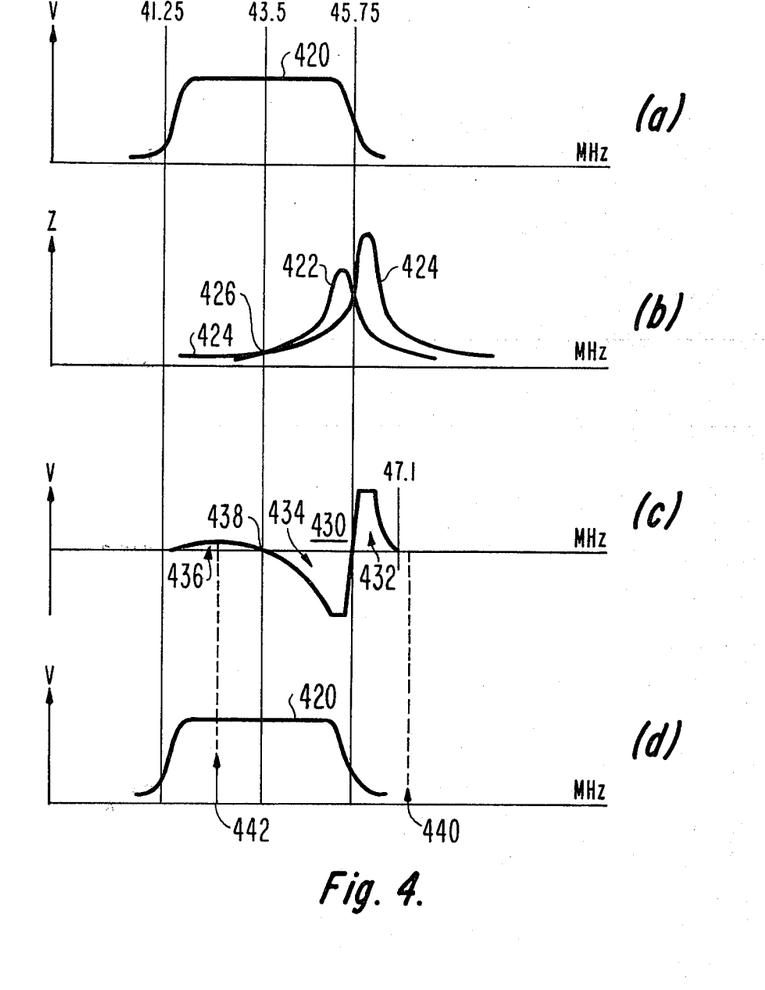
FIGS. 4a–4d illustrate waveforms depicting additional operating features of the AFT circuit of FIG. 1.

When the impedance of tuned circuit 26 is increased still further, an additional feature is obtained, as the AFT output signal characteristic "reverses" and recrosses the X-axis at a point intermediate to the audio and picture carrier locations in the I.F. passband. Referring to FIG. 4a, a waveform 420 represents the response characteristic of the I.F. passband, with the picture carrier located at 45.75 MHz, the midpoint of the upper vestigial slope of the passband, and the audio carrier located at 41.25 MHz, which is approximately 20 db down on the lower vestigial slope of the passband. In FIG. 4b, waveform 422 represents the impedance of tuned circuit 22, and waveform 424 represents the higher impedance of tuned circuit 26. Waveforms 422 and 424 are seen to have a first crossover point at 45.75 MHz, the desired location of the I.F. picture carrier, and a second crossover at point 426, which is located intermediate to the desired locations of the audio and picture carriers. In this example, the impedances and Q's of tuned circuits 22 and 26 were chosen so that the second crossover occurs at 43.5 MHz, which is approximately the midpoint of the I.F. passband 420. Below 43.5 MHz, waveform 424 predominates over waveform 422 to create the reversed curve characteristic.

When the signals of I.F. passband 420 are applied to an AFT circuit having the impedance characteristics of FIG. 4b, the AFT circuit exhibits the response characteristic 430 illustrated in FIG. 4c. Above the 45.75 MHz picture carrier frequency, waveform 430 exhibits a maximum positive excursion about the resonant frequency of tuned circuit 26, which decreases toward the X-axis at the upper limit of the I.F. passband, approximately 47.1 MHz. Reference numeral 432 indicates the area under this portion of waveform 430.

Waveform 430 exhibits a negative excursion between the 43.5 MHz crossover point 438 and the 45.75 carrier frequency. Reference numeral 434 indicates the area between the X-axis and this portion of waveform 430. Finally, waveform 430 exhibits a slight, positive excursion between the desired audio carrier frequency of 41.25 MHz and crossover point 438, with the area under this portion of the waveform 430 indicated by reference numeral 436.

When the television receiver is receiving a weak signal, or a pure noise signal, the noise components in the I.F. passband are applied to the AFT circuit and can affect the AFT output signal. If the AFT output signal does not exhibit a second crossover as illustrated in FIG. 4c, the noise components in area 434 below 45.75 MHz will provide a greater contribution than the noise components of area 432 on the upper vestigial slope of the I.F. passband. The imbalance in noise contribution will tend to shift the first crossover point at 45.75 MHz to a lower frequency, causing mistuning of the local oscillator.

However, when waveform 430 exhibits the reverse curve as illustrated in FIG. 4c, the areas 436 and 432 above the X-axis will be approximately equal to the area 434 below the X-axis. This will result in the negative noise components of area 434 approximately equaling the positive noise components of areas 436 and 432, and a cancellation of noise effects on the AFT response characteristic. Waveform 430 may be contrasted with waveform 414 of FIG. 3e, which does not produce equal positive and negative areas between the waveform 414 and the X-axis. The first crossover of waveform 430 at 45.75 MHz will therefore remain constant and will be unaffected by changes in the signal-to-noise ratio of the I.F. signal.

Waveform 430 provides a further benefit of extended AFT control range. If the I.F. picture carrier 440 shifts to, or is initially located at, a frequency above 47.1 MHz in this example, it is outside the I.F. passband 420 of FIG. 4d and hence substantially attenuated. It is also beyond area 432 of FIG. 4c and therefore outside the range of normal AFT control. However, the audio carrier 442, which has a fixed frequency separation from the picture carrier (4.5 MHz in the NTSC system), is also substantially above its nominal location of 41.25 in the I.F. passband. At this higher frequency, the audio carrier is coincident with the reverse curve region of waveform 430, where the waveform exhibits a positive excursion above the X-axis. The AFT circuit will respond to the location of the audio carrier 442 in the area 436 of positive excursion by retuning the local oscillator so that the I.F. signals are reduced in frequency, and the audio carrier 442 will begin to move toward its normal location of 41.25 MHz in the I.F. passband. As it does so, the picture carrier will follow, until it eventually moves back into area 432 of FIG. 4c, and normal AFT control of the picture carrier will resume. Thus, it is seen that the reverse curve of FIG. 4c can extend the range of effective AFT control.

Figure 5:
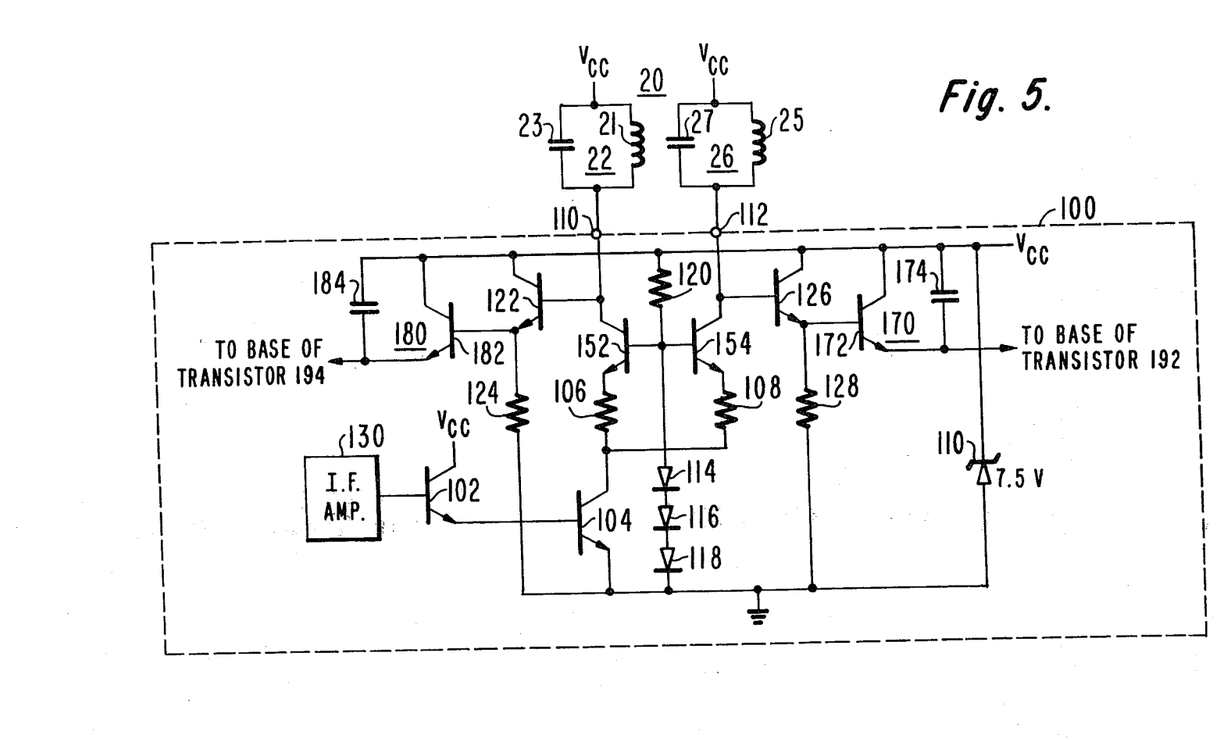
FIGS. 5 and 6 illustrate, partially in block diagram and partially in schematic diagram form, a second embodiment of an AFT circuit constructed in accordance with the principles of the present invention.
Figure 6:
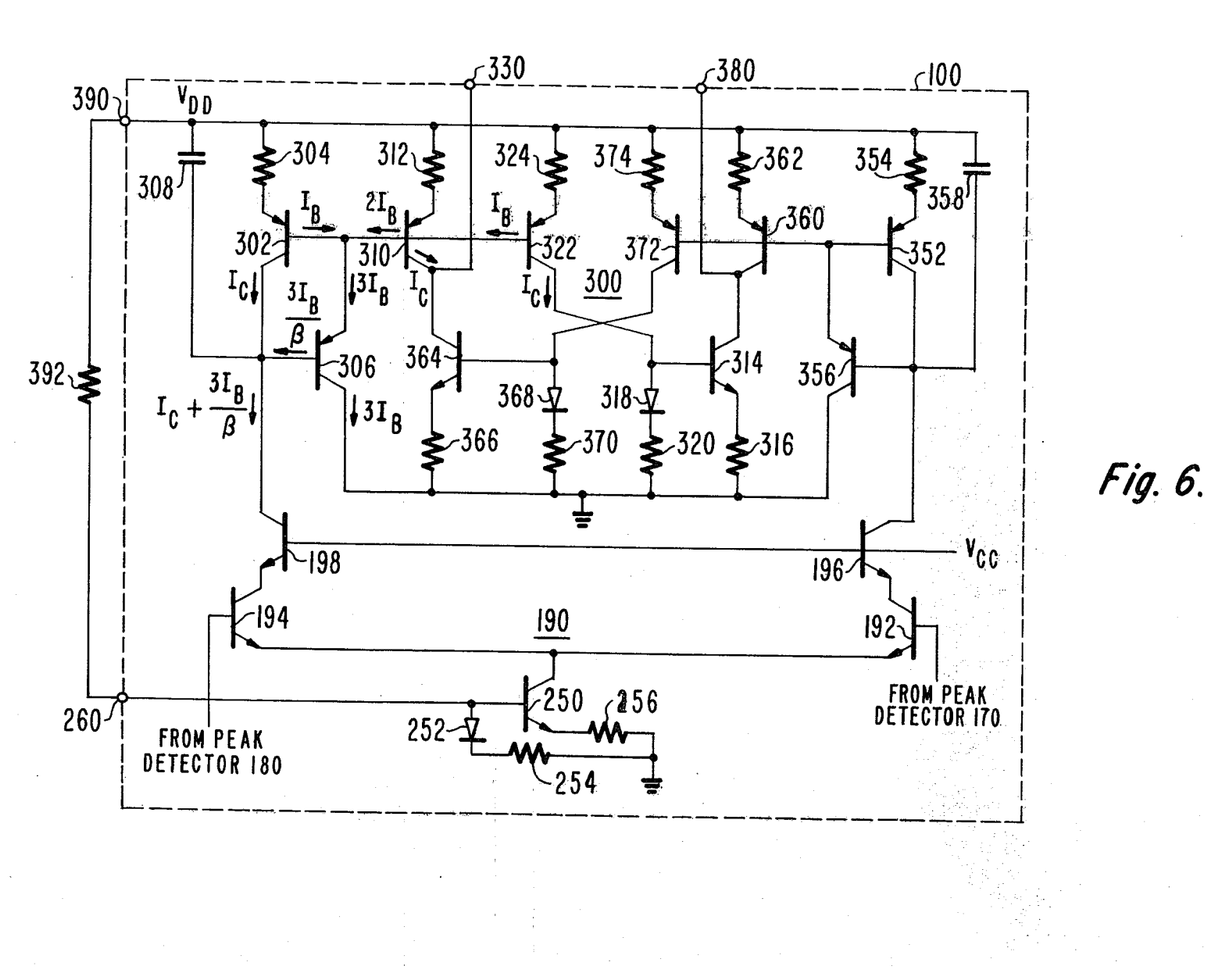

An alternative embodiment of the concepts of the present invention is illustrated in FIGS. 5 and 6. Referring first to FIG. 5, an AFT circuit suitable for substantial fabrication in monolithic integrated circuit form is shown, including an externally located discriminator network 20. The AFT circuit receives I.F. input signals from an I.F. amplifier 130, which may be located on the same I.C. chip 100 as the AFT circuit, or may be externally located. The I.F. input signals are applied to the base electrode of a transistor 102, which has a collector electrode coupled to a source of supply voltage $V_{CC}$ and an emitter electrode coupled to the base electrode of a transistor 104. Transistor 104 has an emitter electrode coupled to a source of reference potential (ground) and supplies I.F. current signals from its collector electrode to the emitter electrodes of transistors 152 and 154 through resistors 106 and 108, respectively. Transistors 152 and 154 are arranged in similar common base configurations, and are biased by the couplings of their base electrodes to the junction of a resistor 120 and a diode 114. Resistor 120 provides bias current from supply voltage source $V_{CC}$, and diode 114, together with diodes 116 and 118, maintains the voltage at the bases of transistors 152 and 154 at three base-to-emitter voltage drops (3 $V_{be}$'s) above ground by their forward biased, serial coupling from resistor 120 to ground.

I.F. current signals of like phase as coupled to external I.C. terminals 110 and 112 from the collector electrodes of transistors 152 and 154, respectively. A discriminator network 20 identical to that shown in FIG. 1 is coupled across external I.C. terminals 110 and 112. For ease of description, the discriminator network 20 of FIG. 5 bears the same reference numerals as the discriminator network 20 of FIG. 1 and will not be discussed in further detail.

The voltage developed at terminal 110 by the tuned circuit 22 is coupled to the base electrode of an emitter follower transistor 112, which has a collector electrode coupled to the $V_{CC}$ supply, and an emitter electrode coupled to ground by a resistor 124. A transistor 182 has a base electrode coupled to the emitter electrode of transistor 122, a collector electrode coupled to the $V_{CC}$ supply and a capacitor 184 coupled from its emitter electrode to its collector electrode. Transistor 182 and capacitor 184 comprise a peak detecting circuit 180, which peak detects the voltage developed at terminal 110 by the tuned circuit 22. The peak detecting capacitor 184 is referenced to the $V_{CC}$ supply rather than ground to confine the peak detecting capacitor charging current to the small loop containing transistor 182 and capacitor 184. When the peak detecting capacitor is referenced to ground, the charging current loop includes the entire power supply path from ground back to the $V_{CC}$ supply, which can introduce noise problems into the circuit. The present peak detecting circuit 180 obviates these problems by charging peak detecting capacitor 184 down from the $V_{CC}$ supply to the peak detected voltage level at the emitter electrode of transistor 182.

A similar emitter follower transistor 126 and peak detecting circuit 170 are coupled to external I.C. terminal 112 to peak detect the voltage developed at that point by the tuned circuit 26. Since these circuit elements operate in an identical manner to transistor 122 and peak detecting circuit 180, further discussion of these components will be omitted.

Referring to FIG. 6, the peak detected signals are coupled to the inputs of a differential amplifier 190. The peak detected level stored by capacitor 174 is coupled to the base of a transistor 192 and the level stored by capacitor 184 is coupled to the base of a transistor 194. The emitter electrodes of transistors 192 and 194 are coupled together and to the collector of a current source transistor 250. The emitter electrode of transistor 250 is coupled to ground by a resistor 256. The base electrode of transistor 250 is coupled to the anode electrode of a diode 252 and to an external I.C. terminal 260. The cathode electrode of diode 252 is coupled to ground by a resistor 254. By proper selection of the values of resistors 254 and 256, current applied to terminal 260 will flow through diode 252 and resistor 254 and will be replicated through the collector-to-emitter path of transistor 250.

The differentially related signals developed at the collectors of transistors 192 and 194 are stepped up in voltage level by transistors 196 and 198. The emitter electrode of transistor 196 is coupled to the collector electrode of transistor 192, and the emitter electrode of transistor 198 is coupled to the collector electrode of transistor 194. The base electrodes of transistors 196 and 198 are coupled to the $V_{CC}$ supply. The amplified, differentially related signals at the collectors of transistors 196 and 198 are coupled to two inputs of a current mirror output circuit 300.

The current mirror 300 is comprised of identical circuit halves which provide differentially varying output currents at external I.C. terminals 330 and 380. Circuit elements 302–324 on the left side of FIG. 6 correspond directly to circuit elements 352–374 on the right side of the FIGURE. To simplify the discussion of the current mirror 300, only the circuit elements 302–324 on the left side of FIG. 6 will be described in detail, but it is to be understood that this description applies equally to corresponding circuit elements 352–374.

The collector electrode of transistor 198 is coupled to the junction of a capacitor 308, the collector electrode of a transistor 302, and the base electrode of a transistor 306. The emitter electrode of transistor 302 is coupled by a resistor 304 to a source of supply voltage $V_{DD}$, as is the second plate of capacitor 308. The $V_{DD}$ supply voltage is normally selected to be compatible with the voltage supply in the local oscillator to which the AFT currents at terminals 330 and 380 are applied. The emitter electrode of transistor 306 is coupled to the base electrodes of transistors 302, 310 and 322. The collector electrode of transistor 306 is coupled to ground.

Output transistor 310 has a collector electrode coupled to an external I.C. terminal 330 and to the collector electrode of a transistor 364. The emitter electrode of transistor 310 is coupled to the $V_{DD}$ supply by a resistor 312. Transistor 322 has an emitter electrode coupled to the $V_{DD}$ supply by a resistor 324 and a collector electrode coupled to the anode electrode of a diode 318 and the base electrode of a transistor 314. The cathode electrode of diode 318 is coupled to ground by a resistor 320, and the emitter electrode of transistor 314 is coupled to ground by a resistor 316. The collector electrode of transistor 314 is coupled to external I.C. terminal 380 and to the collector of output transistor 360.

Ideally, the collector current of transistor 198 should be replicated by the current mirror 300 and reproduced by the collectors of transistors 310 and 322. A simplified current mirror which would produce near identical current replication comprises the above-described circuit elements, with transistor 306 replaced with a direct connection from the base to the collector of transistor 302. However, such an arrangement will result in erroneous collector currents in transistors 310 and 322 when the current mirror is constructed with relatively low $\beta$ (gain) PNP transistors. As FIG. 6 illustrates, the path to the emitter electrode of transistor 306 must conduct the base currents of transistors 302, 310 and 322 ($3I_B$). When transistor 306 is replaced with a direct connection between the base and collector of transistor 302, the collector current of transistor 198 is the sum of the collector current of transistor 302, $I_C$, plus the three base currents of transistors 302, 310, and 322, which is $3I_B$. When transistors 302, 310 and 322 are low $\beta$ transistors, the three base currents are significant when compared with current $I_C$, and the respective collector currents $I_C$ of transistors 310 and 322 will differ from the collector current of transistor 198, which is $I_C + 3I_B$.

But when the current mirror 300 is constructed with transistor 306 as the base current source for transistors 302, 310, and 322, the $3I_B$ current error is substantially reduced. This is because the $3I_B$ base currents are conducted by the emitter-to-collector path of transistor 306, which requires a base current of only $(3I_B)/\beta$, where $\beta$ is the gain of transistor 306. Thus, the $3I_B$ difference between the respective collector currents of transistors 310 and 322, and the collector current of transistor 198 is reduced to a difference of $(3I_B)/\beta$. When the $\beta$ of transistor 306 is ten, for example, it can be seen that the $3I_B$ current error is reduced by an order of magnitude, to $0.3I_B$. This circuit is known as a "$\beta^2$ current mirror", since its accuracy can be matched in a circuit that replaces transistor 306 with a direct connection if the gains of transistors 302, 310 and 322 are the square of the $\beta$'s of the transistors used in the present circuit.

The output AFT currents developed at external I.C. terminals 330 and 380 vary differentially; the output current at I.C. terminal 330 is equal to the collector current of transistor 198 less the collector current of transistor 196, and the output current at I.C. terminal 380 is equal to the collector current of transistor 196 less the collector current of transistor 198. It is seen from FIG. 6 that the collector current of transistor 198 is replicated by current mirror transistors 302, 306 and 310 to produce an essentially identical collector current in transistor 310. The collector current of transistor 196 is likewise replicated by transistors 352, 356, and 372 to produce a virtually identical collector current in transistor 372. The collector current of transistor 372 is conducted by diode 368, which is arranged in a high gain, NPN current mirror configuration with transistor 364, to produce a matching collector current in transistor 364. Thus, the output AFT current provided at I.C. terminal 330 is equal to the difference between the collector currents of transistors 310 and 364, which is equal to the difference between the collector currents of transistors 198 and 196. The output AFT current provided at I.C. terminal 380 is likewise equal to the difference between the collector currents of transistors 360 and 314, which is equal to the difference between the collector currents of transistors 196 and 198.

When the frequency of the I.F. picture carrier provided by I.F. amplifier 130 in FIG. 5 is equal to the crossover frequency of the response characteristics of the tuned circuits 22 and 26, identical voltages are developed by the discriminator network at external I.C. terminals 110 and 112. These voltages are detected by peak detectors 180 and 170 and applied to the inputs of differential amplifier 190. This results in the flow of substantially identical collector currents in transistors 196 and 198, and their difference produces no AFT output currents at I.C. terminals 330 and 380. However, when the input I.F. signal shifts away from the crossover frequency of the tuned circuits 22 and 26, the differentially varying voltages which are developed at external I.C. terminals 110 and 112 and detected by peak detectors 180 and 170 result in the generation of differentially related collector currents in transistors 196 and 198. These collector currents are combined by current mirror 300, causing a flow of current of one polarity at one of the I.C. terminals 330 or 380, and an equal current flow of opposite polarity at the other I.C. terminal. These AFT currents may be used to alter the reactance of a variable reactance tuning element in the local oscillator of the television tuner.

The magnitudes of the AFT output currents corresponding to various shifts in I.F. frequency are controlled by the current mirror comprising diode 252 and transistor 250, which is the source of supply current for differential amplifier 190. When an input current is supplied to external I.C. terminal 260, it is conducted to ground by diode 252 and replicated in the collector of transistor 250. The collector current of transistor 250 is divided by differential amplifier transistors 192 and 194 and coupled to transistors 196 and 198, where the divided currents appear at the collectors of transistors 196 and 198. Thus, the total current supplied to current mirror 300 is controlled by the current applied to I.C. terminal 260, and the magnitudes of the AFT output currents are controlled accordingly.

It was found that, with current mirror 300 operating over a wide range of current outputs, the two loops defined by transistors 302 and 306, and transistors 352 and 356, had a tendency to oscillate under certain signal and load conditions. To prevent these undesirable oscillations, capacitors 308 and 358 were added across the emitter-to-collector paths of transistors 302 and 352, respectively. These capacitors prevent oscillations in the respective transistor loops by creating a single dominant pole in the root-locus plots of the loop transfer functions, thereby stabilizing the operation of current mirror 300.

Figure 7:
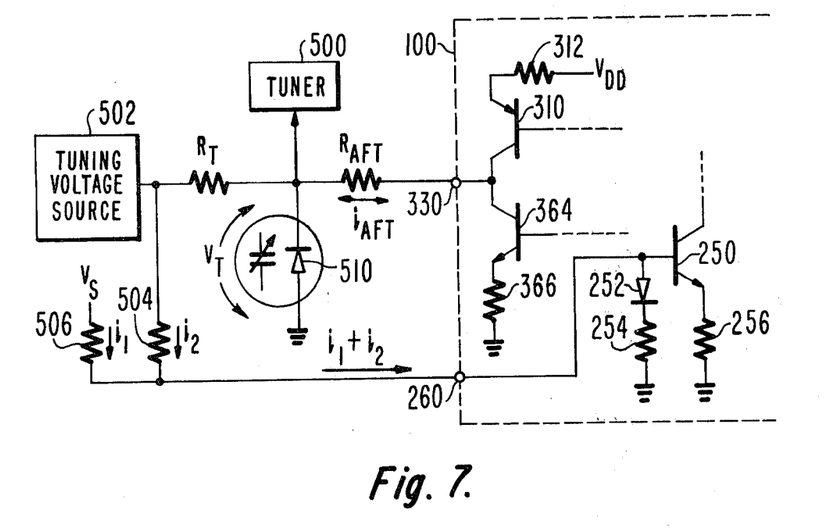
FIG. 7 illustrates, partially in schematic diagram form and partially in block diagram form, a circuit arrangement for supplying a continuously varying AFT signal to a reactive element in a local oscillator.

The AFT circuit described in conjunction with FIGS. 5 and 6 may be used to vary the capacitance of a tuning varactor diode in a television receiver as illustrated in FIG. 7. Referring to that FIGURE, integrated circuit 100 of FIGS. 5 and 6 is partially illustrated, with only the internal circuit elements connected to external I.C. terminals 330 and 260 shown in schematic detail. In this embodiment of the present invention, only one AFT output terminal (330) is used. The other terminal (380) remains unconnected.

A tuning voltage for a varactor diode 510 is provided by a tuning voltage source 502. The tuning voltage varies in accordance with the selected channel to which the television receiver is tuned. The voltage supplied by tuning voltage source 502, $V_T$, is coupled through a resistance $R_T$ and applied to the cathode electrode of varactor diode 510. The tuning voltage is also coupled to a resistor 504 to produce a current $i_2$, which is coupled to I.C. terminal 260 of the integrated circuit 100. Current $i_2$ is combined with a constant current $i_1$ which is coupled from a voltage source $V_S$ to terminal 260 by a resistor 506. The sum of currents $i_1$ and $i_2$ are conducted to ground by diode 252 and resistor 254 to produce a collector current in transistor 250 which is equal to the sum of $i_1 + i_2$. The collector current $i_1 + i_2$ of transistor 250 is divided by differential amplifier 190 as previously described to produce a differential output AFT current $i_{AFT}$ at external I.C. terminal 330. The AFT current $i_{AFT}$ is coupled through a resistance $R_{AFT}$ to develop an AFT control voltage component across $R_T$ at the cathode electrode of varactor diode 510. The varactor diode 510 will therefore exhibit a capacitance which is determined by the net voltage resulting from the tuning and AFT voltages applied at its cathode electrode with respect to ground. This capacitance is coupled to a tuner 500 to tune the local oscillator contained therein to the correct frequency for R.F. to I.F. signal conversion.

Figure 8:
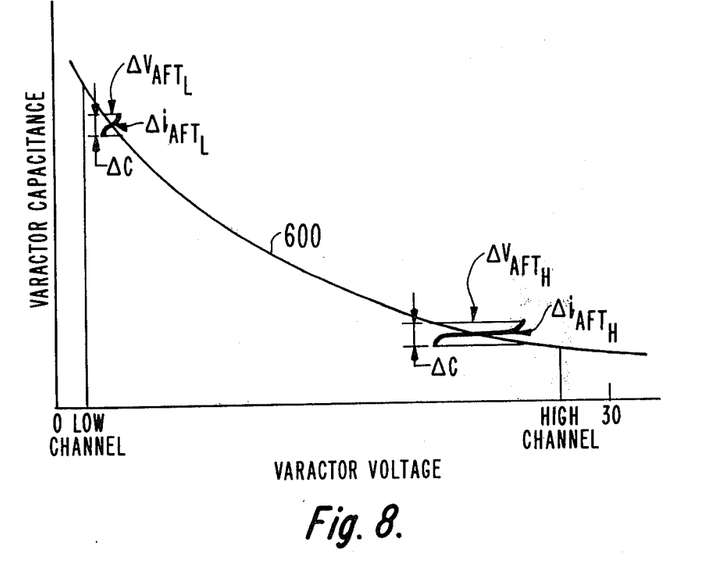
FIG. 8 illustrates graphically the effect of AFT control on the reactive element of FIG. 7.

The capacitance of the varactor diode 510 does not change linearly with applied voltage, but varies nonlinearly, as illustrated by curve 600 in FIG. 8. As this FIGURE indicates, at a lower channel, a small voltage channel $\Delta V_{AFTL}$ results from a small swing in output AFT current $\Delta i_{AFTL}$, creating a change over a range $\Delta C$ in varactor diode capacitance. However, in order to develop the same capacitance swing $\Delta C$ at higher channels, the output AFT current must have a higher swing $\Delta i_{AFTH}$, to create a large AFT voltage swing $\Delta V_{AFTH}$. The circuit arrangement of FIG. 7 will have this characteristic, for as the television receiver is switched to higher channels, the tuning voltage and the current $i_2$ provided by tuning voltage source 502 increase. The sum of currents $i_1$ and $i_2$ will increase, thereby supplying more current to I.C. terminal 260 and the current mirror comprised of diode 252 and transistor 250. The collector current supplied by transistor 250 to the differential amplifier 190 will therefore increase, which increases the magnitude of the output AFT current $i_{AFT}$. The larger AFT current $i_{AFT}$ will produce a greater AFT voltage swing at the cathode electrode of varactor diode 510, allowing the capacitance of the varactor diode to be varied over a substantially constant range of capacitance values $\Delta C$. Thus, the capacitance coupled to the tuner 500 may be varied by the AFT circuit over a virtually constant range of changing limits as the television receiver is tuned from channel to channel.

While the AFT circuit of the present invention may be advantageously used in an embodiment such as that illustrated in FIG. 7, in which the range of magnitudes of the output AFT circuit is varied by changing the current applied to I.C. terminal 260, the circuit may be readily used in an application which requires a fixed AFT signal range. For example, an embodiment of the AFT circuit of the present invention can be used to provide the AFT signal for the television receiver described in RCA Service Data 1978 No. C-2 for a CTC-87 type receiver, published by RCA Corporation, Indianapolis, Ind., which utilizes a fixed AFT signal range. The AFT circuit of FIG. 7 will produce an output AFT signal with a predetermined range of current magnitudes when a fixed current source is applied to external I.C. terminal 260. This may be accomplished by connecting an external resistor 392 from the $V_{DD}$ supply terminal 390 to terminal 260. The external resistor 392 will conduct a constant current to diode 252 and transistor 250, thereby providing a constant emitter current for division by differential amplifier 190. The range of current magnitudes is determined by the value selected for the external resistor 392, which permits the AFT output current signal to be precisely matched to the requirements of the tuner which is being controlled by the AFT signal.

What is claimed:

1. Frequency discriminating apparatus for detecting the frequency deviation of a carrier signal from a predetermined reference frequency, said carrier signal having a higher amplitude for frequency deviation of a first sense from said reference frequency than for frequency deviation of a second sense which is opposite said first sense, comprising:
a first tuned circuit having a first resonant frequency which differs from said predetermined reference frequency in said first sense, and exhibiting a given impedance at said first resonant frequency;
a second tuned circuit having a second resonant frequency which differs from said predetermined reference frequency in said second sense and exhibiting an impedance at said second resonant frequency which is greater than said given impedance;
means for applying said carrier signal to said first and second tuned circuits; and
first and second detector networks coupled to said respective tuned circuits for detecting voltage signals developed by said tuned circuits in response to said carrier signal.

2. In a television receiver, including apparatus for producing an intermediate frequency signal comprising a video modulated carrier and an audio modulated carrier having a fixed frequency separation from one another, an automatic frequency control system comprising:
a first tuned circuit having a first resonant frequency which differs from a predetermined reference frequency in a first sense and exhibiting a resonance characteristic providing an impedance of a given magnitude at said first resonant frequency;
a second tuned circuit having a second resonant frequency which differs from said predetermined reference frequency in a second sense opposite said first sense, and exhibiting a resonance characteristic providing an impedance at said second resonant frequency of a magnitude greater than said given magnitude;
means for applying said intermediate frequency signal to said first and second tuned circuits;
first and second detector networks coupled to said respective tuned circuits for detecting output signals developed by said tuned circuits in response to said intermediate frequency signal; and
means for combining said detected output signals to develop an automatic frequency control signal;
wherein the difference between the resonance characteristics of said first and second tuned circuits is such as to provide said automatic frequency control system with a response characteristic exhibiting response of one polarity for a first frequency range and a second frequency range, and of a polarity opposite said one polarity for a third frequency range adjacent to said reference frequency and intermediate said first and second frequency ranges.

3. The apparatus of claims 1 or 2, wherein:
the quality factor of said first tuned circuit is substantially equal to the quality factor of said second tuned circuit.

4. The apparatus of claim 3, wherein:
said predetermined reference frequency is the desired frequency of the I.F. picture carrier, said first tuned circuit has a resonant frequency which is less than said desired frequency, and said second tuned circuit has a resonant frequency which is greater than said desired frequency.

5. The apparatus of claim 2, wherein:
said first frequency range extends upward in frequency from said reference frequency, and said second frequency range extends downward in frequency from a frequency intermediate the desired frequencies of said video and audio modulated carriers.

6. The apparatus of claim 2, wherein:
the waveform of said automatic frequency control system response characteristic intersects a zero-response axis at said reference frequency, and the sum of the areas bounded by said waveform and said axis in said first and second frequency ranges is substantially equal to the area bounded by said waveform and said axis in said third frequency range.

7. Frequency discriminating apparatus for detecting the frequency deviation of an input signal from a predetermined reference frequency comprising:
a first tuned circuit having a resonant frequency which is lower than said predetermined reference frequency;
a second tuned circuit having a resonant frequency which is higher than said predetermined reference frequency;
a first amplifying device coupled in series with said first tuned circuit across two terminals of a power supply and responsive to said input signal for supplying a first signal current to said first tuned circuit;

a second amplifying device coupled in series with said second tuned circuit across said two terminals of a power supply and responsive to said input signal for supplying a second signal current of the same phase as said first signal current to said second tuned circuit; and first and second detector networks respectively coupled to the junction of said first tuned circuit and said first amplifying device, and the junction of said second tuned circuit and said second amplifying device, for detecting voltage variations developed by said tuned circuits at said junctions in response to said input signal currents;

wherein said amplifying devices and said detector networks, and the junctions thereof, are realized in integrated circuit form on a common, monolithic integrated circuit chip, wherein each of said junctions further comprises an external connection terminal of said integrated circuit chip, and wherein said first and second tuned circuits comprise components separate from said chip and respectively coupled to said external connection terminals.

8. In a television receiver, including a source of tuning voltage, and a tuner, including a reactive element responsive to said tuning voltage and an automatic frequency control signal, for producing a mixing signal to convert radio frequency television signals to intermediate frequency television signals within a band including a predetermined reference frequency, an automatic frequency control signal generator comprising:

a first tuned circuit having a resonant frequency which is lower than said predetermined reference frequency;

a second tuned circuit having a resonant frequency which is higher than said predetermined reference frequency;

a first amplifying device coupled in series with said first tuned circuit across two terminals of a power supply responsive to said intermediate frequency signals for supplying a first signal current to said first tuned circuit;

a second amplifying device coupled in series with said second tuned circuit across said two terminals of a power supply and responsive to said intermediate frequency signals for supplying a second signal current of the same phase as said first signal current to said second tuned circuit;

first and second detector networks respectively coupled to the junction of said first tuned circuit and said first amplifying device, and the junction of said second tuned circuit and said second amplifying device, for detecting voltage variations developed by said tuned circuits at said junctions in response to said intermediate frequency signals, a differential amplifier coupled to said detector networks for developing output signals which vary differentially in sense and magnitude in response to the magnitudes of the signals detected by said detector networks; and means coupled to said differential amplifier for combining said output signals to develop an automatic frequency control signal which varies in sense and magnitude in response to the frequency deviation of said intermediate frequency signals from said predetermined reference frequency, wherein said amplifying devices, said detector networks, said differential amplifier and said combining means, and the junctions thereof, are realized in integrated circuit form on a common, monolithic integrated circuit chip, wherein said junctions further comprise respective first and second external connection terminals of said integrated circuit chip, wherein said first and second tuned circuits comprise components separate from said chip and respectively coupled to said first and second external connection terminals, and wherein said automatic frequency control signal is coupled to said reactive element at a third external connection terminal to control the frequency of said mixing signal.

9. The automatic frequency control signal generator of claim 8, further comprising:

a controllable current source located on said integrated circuit chip and having an input coupled to a fourth external connection terminal and an output coupled to said differential amplifier; and means for applying said tuning voltage to said fourth external connection terminal for varying the magnitude of the sum of said output signals for a given deviation of said intermediate frequency signals from said reference frequency.

10. The automatic frequency control signal generator of claim 8, wherein said first tuned circuit exhibits a given impedance at said resonant frequency which is lower than said predetermined frequency, and said second tuned circuit exhibits an impedance at said resonant frequency which is higher than said predetermined frequency which is greater than said given impedance.

* * * * *